(12) United States Patent
Kim (10) Patent No.: US 7,239,566 B2
(45) Date of Patent: Jul. 3, 2007

(54) SEMICONDUCTOR MEMORY DEVICE AND METHOD OF PRECHARGING GLOBAL INPUT/OUTPUT LINES THEREOF

(75) Inventor: Byung-Chul Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 21 days.

(21) Appl. No.: 11/185,375

(22) Filed: Jul. 20, 2005

(65) Prior Publication Data

US 2006/0018168 A1 Jan. 26, 2006

(30) Foreign Application Priority Data

Jul. 22, 2004 (KR) ...................... 10-2004-0057384

(51) Int. Cl.
*G11C 7/00* (2006.01)
(52) U.S. Cl. .................................. 365/203; 365/230.03
(58) Field of Classification Search ................... 365/51, 365/63, 198, 203 O, 230.03 X, 203, 230.03
See application file for complete search history.

(56) References Cited

U.S. PATENT DOCUMENTS

| | | | |
|---|---|---|---|
| 6,236,616 B1 * | 5/2001 | Kim et al. ............. | 365/230.03 |
| 6,275,430 B1 * | 8/2001 | Ka .............................. | 365/203 |
| 6,366,503 B2 * | 4/2002 | Sonoda ................... | 365/189.05 |
| 6,414,896 B1 * | 7/2002 | Kim et al. ............. | 365/230.03 |
| 6,538,941 B2 * | 3/2003 | Noh ........................... | 365/203 |
| 6,661,721 B2 | 12/2003 | Lehmann et al. | |
| 6,901,017 B2 * | 5/2005 | Shimizu ...................... | 365/203 |
| 6,930,939 B2 * | 8/2005 | Lim et al. ................... | 365/203 |
| 6,985,394 B2 * | 1/2006 | Kim ........................... | 365/203 |
| 7,006,396 B2 * | 2/2006 | Kodama ..................... | 365/203 |

FOREIGN PATENT DOCUMENTS

| JP | 01076489 | 3/2001 |
|---|---|---|
| KR | 010069001 | 7/2001 |

* cited by examiner

*Primary Examiner*—VanThu Nguyen
(74) *Attorney, Agent, or Firm*—F. Chau & Assoc., LLC (57) ABSTRACT

There are provided a semiconductor memory device and a method of precharging global input/output (I/O) lines thereof, for reducing power consumption during a precharge operation. The semiconductor memory device includes a pair of first global I/O lines; a pair of second global I/O lines; a first precharge circuit for precharging the pair of first global I/O lines in response to a first precharge enable signal; a second precharge circuit for precharging the pair of second global I/O lines in response to a second precharge enable signal; a switch for connecting the pair of first global I/O lines and the pair of second global I/O lines; a first precharge driver for enabling the first precharge enable signal during a precharge operation; and a second precharge driver for enabling the second precharge enable signal during a precharge operation.

24 Claims, 4 Drawing Sheets

SEMICONDUCTOR MEMORY DEVICE AND METHOD OF PRECHARGING GLOBAL INPUT/OUTPUT LINES THEREOF

CROSS-REFERENCE TO RELATED APPLICATION

This application claims priority from Korean Patent Application No. 2004-57384, filed Jul. 22, 2004, the disclosure of which is hereby incorporated by reference in its entirety herein.

BACKGROUND OF THE INVENTION

1. Technical Field

The present invention relates to a semiconductor memory device and a method of precharging global input/output lines thereof, and more particularly, to a semiconductor memory device and a method of precharging global input/output lines thereof for reducing the power consumed during a precharge operation of global input/output lines.

2. Discussion of the Related Art

A typical semiconductor memory device writes or reads data to or from memory cells contained within internal memory banks using layered I/O lines with a need to precharge the layered I/O lines before or after write or read operations.

As the storage capacity of the semiconductor memory device increases, the semiconductor memory device is provided with more memory banks, and the length of global I/O lines running over the increased number of memory banks is increased accordingly.

As the number and the size of precharge drivers for precharging the global I/O lines is also increased, the power consumed for precharge operations is also increased.

In a conventional semiconductor memory device, the global I/O lines are divided into upper global I/O lines running over upper memory banks and lower global I/O lines running over lower memory banks. The upper and lower global I/O lines are connected or disconnected by a switching portion.

For example, in the case that the upper memory banks are selected, the switching portion connects the upper global I/O lines and the lower global I/O lines, so that data is input or output through the upper and lower global I/O lines. In the case that the lower memory banks are selected, the switching portion disconnects the upper global I/O lines and the lower global I/O lines, so that data is input or output only through the lower global I/O lines.

As described above, the semiconductor memory device does not use all the global I/O lines in write or read operations. That is, when the lower memory bank is selected and data is input or output only through the lower global I/O lines, the upper global I/O lines are not used, an existing precharge voltage Vdd is maintained and the upper global I/O lines do not require a precharge operation.

The conventional semiconductor memory device receives bank selection signals from the outside and selects a specific memory bank among a plurality of memory banks.

Therefore, a need exists for a semiconductor memory device which detects the region of the global I/O lines through which data is input or output, using the bank selection signal, and actuates only a precharge driver corresponding to the region of the detected global I/O lines performing a precharge operation, thereby reducing the power consumption during precharge operations.

SUMMARY OF THE INVENTION

In accordance with an exemplary embodiment, the present invention provides a semiconductor memory device including a pair of first global I/O lines; a pair of second global I/O lines; a first precharge circuit for precharging the pair of first global I/O lines in response to a first precharge enable signal; a second precharge circuit for precharging the pair of second global I/O lines in response to a second precharge enable signal; a switch for connecting the pair of first global I/O lines and the pair of second global I/O lines; a first precharge driver for enabling the first precharge enable signal during a precharge operation; and a second precharge driver for enabling the second precharge enable signal during a precharge operation.

In accordance with another exemplary embodiment, the present invention provides a semiconductor memory device including a pair of first global I/O lines for inputting or outputting data to or from a first memory region when the first memory region is selected; a pair of second global I/O lines for inputting or outputting data to or from the pair of first global I/O lines when the first memory region is selected and for inputting or outputting data to or from a second memory region when the second memory region is selected; a first precharge circuit for precharging the pair of first global I/O lines when the first memory region is selected during a precharge operation; a second precharge circuit for precharging the pair of second global I/O lines during a precharge operation; and a switch for connecting the pair of first global I/O lines and the pair of second global I/O lines when the first memory region is selected.

In another aspect of the present invention, the present invention provides a method of precharging global I/O lines of the semiconductor memory device structured as above. The method includes a first precharge step of precharging the pair of first global I/O lines and the pair of second global I/O lines concurrently when the first memory region is selected during a precharge operation; and a second precharge step of precharging only the pair of second global I/O lines, when the second memory region is selected during a precharge operation.

BRIEF DESCRIPTION OF THE DRAWINGS

The above and other features of the present invention will become more apparent to those of ordinary skill in the art by describing in detail exemplary embodiments thereof with reference to the attached drawings in which.

DETAILED DESCRIPTION OF THE PREFERRED EMBODIMENTS

The present invention will now be described more fully hereinafter with reference to the accompanying drawings, in which exemplary embodiments of the invention are shown. In the drawings, the thicknesses of layers and regions are exaggerated for clarity. Like numbers refer to like elements throughout the specification.

Figure 1:
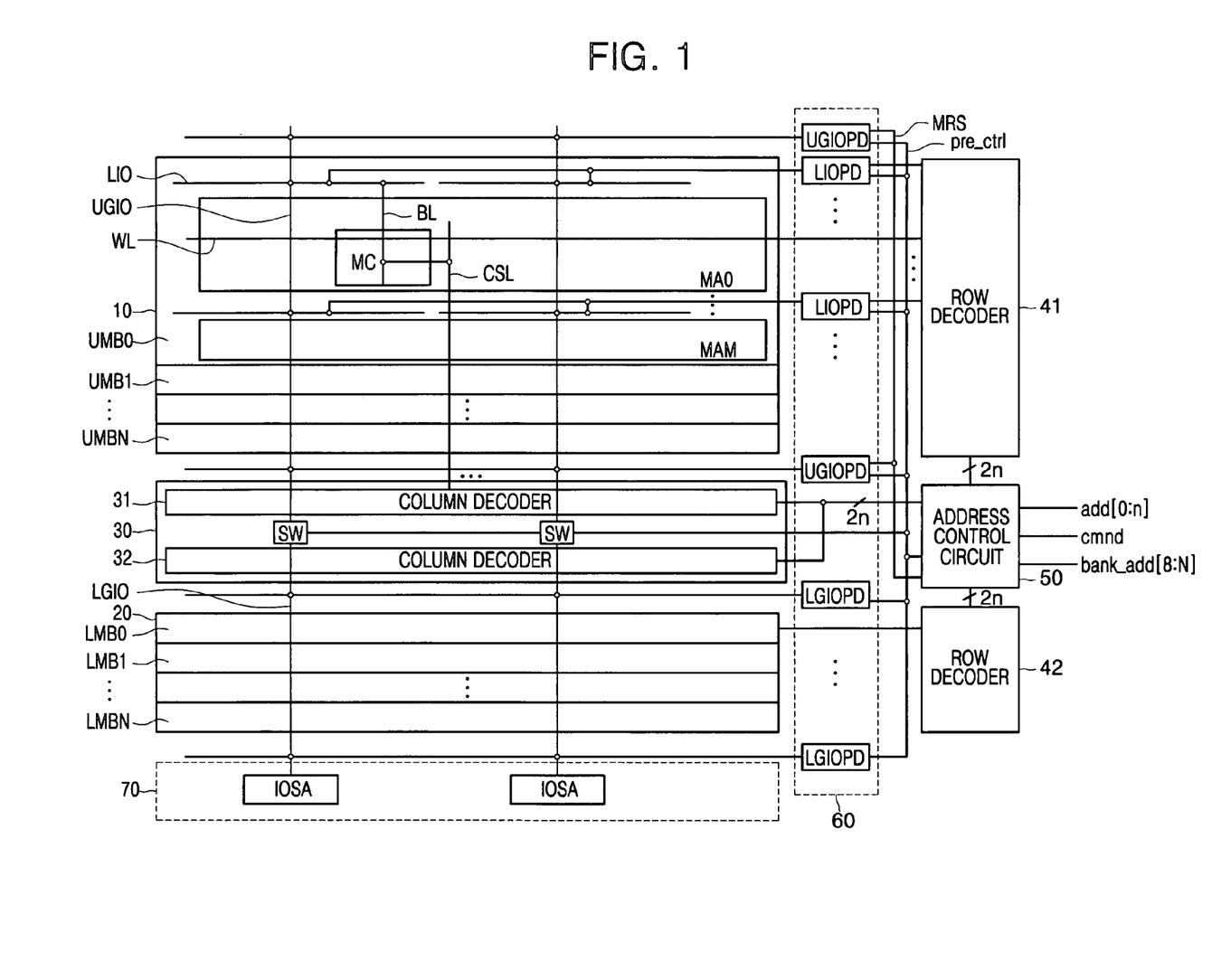
FIG. 1 is a block diagram of a memory core of a semiconductor memory device according to one embodiment of the present invention.

FIG. 1 is a block diagram of a memory core of a semiconductor memory device according to one embodiment of the present invention. The memory core includes a first memory region 10, a second memory region 20, a column decoder 30, first and second row decoders 41 and 42, an address control circuit 50, a precharge control unit 60, and a data input/output unit 70.

The first memory region 10 includes a plurality of upper memory banks UMB0 to UMBN aligned in a column, and each memory bank includes a plurality of memory cell arrays MA0 to MAM. Each memory cell array MA0 to MAM includes a plurality of memory cells MC aligned in a matrix so that data is written or read through the memory cells MC.

The term "upper" means that the memory bank is located relatively further away from an I/O line sense amplifier IOSA.

The second memory region 20 includes a plurality of lower memory banks LMB0 to LMBN aligned in a column, and each memory bank LMB0 to LMBN includes a plurality of memory cell arrays. Each memory cell array includes a plurality of memory cells MC aligned in a matrix so that data is written or read through the memory cells MC.

The term "lower" means that the memory bank is located relatively closer to the I/O line sense amplifier IOSA.

The column decoder 30 includes a first column decoder 31, a second column decoder 32, and a switching means SW. The first column decoder 31 enables a column selection signal line CSL of the first memory region 10, and the second column decoder 32 enables a column selection signal line CSL of the second memory region 20. The switching means SW is located between the first column decoder 31 and the second column decoder 32 and controls the connection of the upper and lower global I/O lines UGIO and LGIO.

The first row decoder 41 enables a word line WL of the first memory region 10, and the second row decoder 42 enables a word line WL of the second memory region 20. The first and second row decoders 41 and 42 provide a local I/O line precharge driver LIOPD with the enable information thereof.

The address control circuit 50 receives a command signal cmnd, an address add[0:n], and a bank selection address bank_add[0:N] (bank selection signal), typically from the outside, to generate a precharge control signal pre_ctrl and a memory region selection signal MRS, and provides a row address or a column address to the first and second row decoders 41 and 42 or the first and second column decoders 31 and 32. That is, the address control circuit 50 generates the precharge control signal pre_ctrl to enable a precharge operation in response to the command signal cmnd, and the memory region selection signal MRS to select a memory region on which a precharge operation is performed in response to the bank selection address bank_add[0:N]. In response to the command signal cmnd, the address control circuit 50 also sends the received address to the first and second column decoders 31 and 32 when the received address is the column address and to the first and second row decoders 41 and 42 when the received address is the row address.

In the case where a memory core of the semiconductor memory device includes $2^{(N+1)}$ memory banks, the bank selection address bank_add[0:N] of N+1 bits provides information for selecting a specific memory bank, in which the most significant bit of the bank selection address bank_add(N) provides the information for selecting the memory region.

Thus, the address control circuit 50 of the present invention generates the memory region selection signal MRS based on the most significant bit of the bank selection address bank_add(N).

The precharge control unit 60 includes upper global I/O line precharge drivers UGIOPD (hereinafter "upper precharge drivers"), lower global I/O line precharge drivers LGIOPD (hereinafter "lower precharge drivers"), local I/O line precharge drivers LIOPD, upper global I/O line precharge circuits (not shown) (hereinafter "upper precharge circuits"), lower global I/O line precharge circuits (not shown) (hereinafter "lower precharge circuits"), and local I/O line precharge circuits (not shown).

The upper precharge drivers UGIOPD respond to the precharge control signal pre_ctrl and the memory region selection signal MRS to generate upper precharge enable signals. The lower precharge drivers LGIOPD respond to the precharge control signal pre_ctrl to generate lower precharge enable signals. The local I/O line precharge drivers LIOPD respond to the precharge control signal pre_ctrl and enable information from the first and second row decoders 41 and 42 to generate local precharge enable signals.

Thus, in response to the upper precharge enable signals, the upper precharge circuits precharge upper global I/O lines UGIO. In response to the lower precharge enable signals, the lower precharge circuits precharge lower global I/O lines LGIO. In response to the local I/O line precharge enable signals, the local I/O line precharge circuits precharge local I/O lines LIO.

The data I/O unit 70 includes a plurality of I/O line sense amplifiers IOSA. The I/O line sense amplifiers IOSA are connected to the lower global I/O lines LGIO, and sense and amplify the data transmitted through the lower global I/O lines LGIO, typically to the outside.

Thus, the local I/O lines LIO are precharged and equalized by a precharge voltage Vdd using local I/O line precharge drivers LIOPD and local I/O line precharge circuits LIOPC during a precharge operation. Data from bit lines BL are transmitted to the global I/O lines UGIO and LGIO during a read operation and data from the global I/O lines UGIO and LGIO are transmitted to the bit lines BL during a write operation.

If the first memory region 10 is selected, the upper global I/O lines UGIO are precharged and equalized by a precharge voltage Vdd using the upper precharge drivers UGIOPD and the upper precharge circuits UGIOPC during a precharge operation. Data from the local I/O lines LIO of the first memory region 10 are transferred to the lower global I/O lines LGIO, during a read operation and data from the lower global I/O lines LGIO is transferred to the local I/O lines LIO of the first memory region 10 during a write operation.

If the first memory region 10 or the second memory region 20 is selected, the lower global I/O lines LGIO are precharged and equalized by a precharge voltage Vdd using the lower precharge drivers LGIOPD and the lower precharge circuits LGIOPC during a precharge operation. Data from the local I/O lines LIO of the second memory region 20 or the upper global I/O lines UGIO are transferred to the I/O line sense amplifiers IOSA during a read operation, and data from the I/O line sense amplifiers IOSA are transferred to the local I/O lines LIO of the second memory region 20, or the upper global I/O lines UGIO, during a write operation.

The plurality of precharge circuits UGIOPC and LGIOPC are connected to the global I/O lines UGIO and LGIO, thereby safely applying a desired precharge level to the overall global I/O lines UGIO and LGIO.

Figure 2:
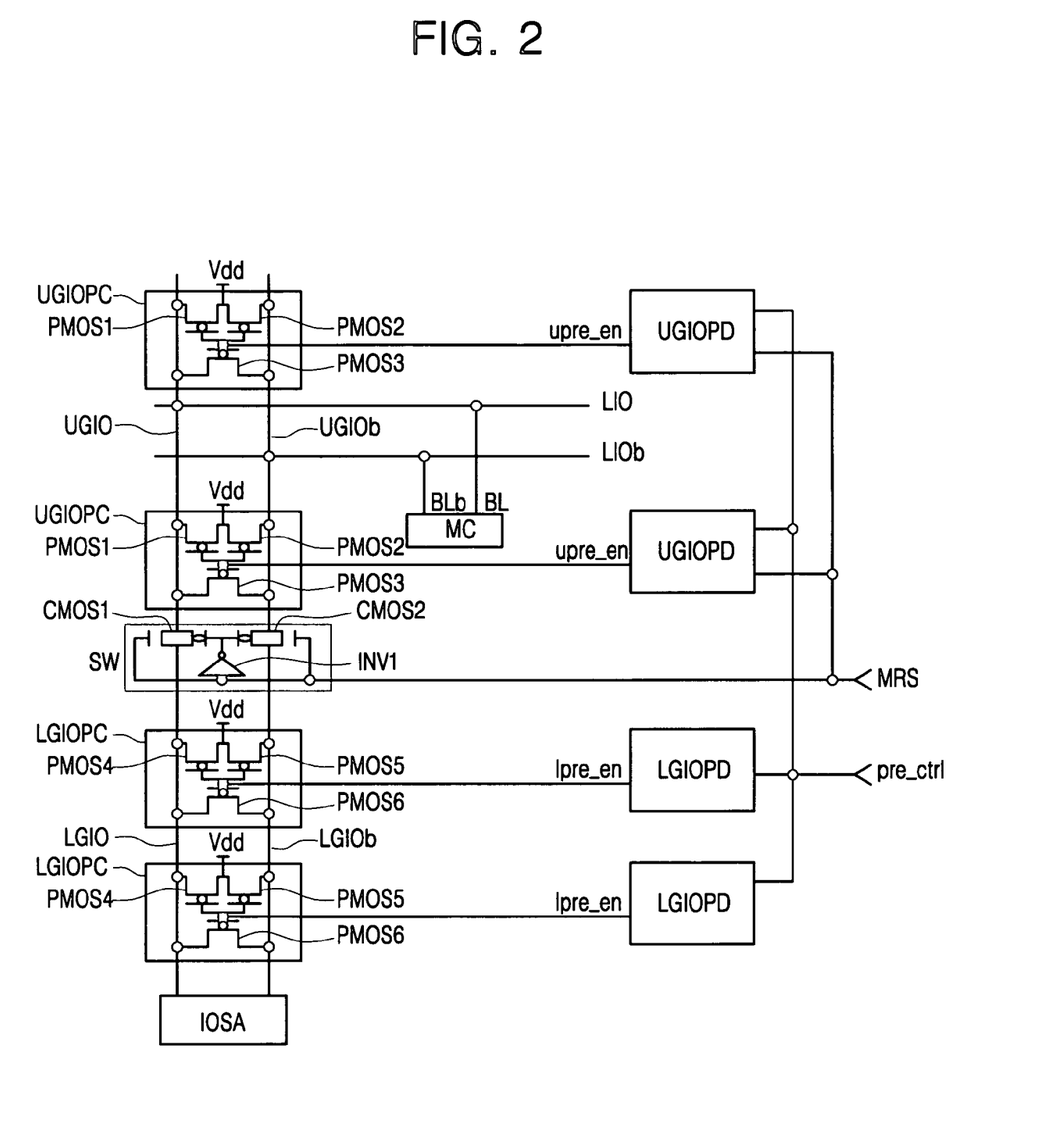
FIG. 2 shows a precharge path of global I/O lines of FIG. 1.

FIG. 2 shows a precharge path of global I/O lines of FIG. 1. The global I/O line includes a pair of lower global I/O lines LGIO/LGIOb and a pair of upper global I/O lines UGIO/UGIOb, a switching means SW is connected between the pair of lower global I/O lines LGIO/LGIOb and the pair of upper global I/O lines UGIO/UGIOb. An I/O line sense amplifier IOSA is connected to the end of the pair of lower global I/O lines LGIO/LGIOb.

The upper precharge circuit UGIOPC, which is controlled by the upper precharge driver UGIOPD, is connected to the upper global I/O lines UGIO/UGIOb, and the lower precharge circuit LGIOPC, which is controlled by the lower precharge driver LGIOPD, is connected to the lower global I/O lines LGIO/LGIOb.

Now, the circuit structures of the upper precharge circuit UGIOPC, the lower precharge circuit LGIOPC, and the switching means SW are described as follows.

The upper precharge circuit UGIOPC includes a first PMOS transistor PMOS1, the source of which is applied with a precharge voltage Vdd, the gate of which is applied with an upper precharge enable signal upre_en and the drain of which is connected to an upper global input/output line UGIO; a second PMOS transistor PMOS2, the source of which is applied with the precharge voltage Vdd, the gate of which is applied with the upper precharge enable signal upre_en and the drain of which is connected to a complementary upper global I/O line UGIOb; and a third PMOS transistor PMOS3, the source of which is connected to the upper global I/O line UGIO, the drain of which is connected to the complementary upper global I/O line UGIOb and the gate of which is applied with the upper precharge enable signal upre_en. The upper precharge circuit UGIOPC precharges and equalizes the pair of upper global I/O lines UGIO/UGIOb in response to the upper precharge enable signal upre_en.

The lower precharge circuit LGIOPC includes a fourth PMOS transistor PMOS4, the source of which is applied with the precharge voltage Vdd, the gate of which is applied with a lower precharge enable signal lpre_en and the drain of which is connected to a lower global I/O line LGIO; a fifth PMOS transistor PMOS5, the source of which is applied with the precharge voltage Vdd, the gate of which is applied with the lower precharge enable signal lpre_en and the drain of which is connected to a complementary lower global I/O line LGIOb; and a sixth PMOS transistor PMOS6, the source of which is connected to the lower global I/O line LGIO, the drain of which is connected to the complementary lower global I/O line LGIOb and the gate of which is applied with the lower precharge enable signal lpre_en. The lower precharge circuit LGIOPC precharges and equalizes the pair of lower global I/O lines LGIO/LGIOb in response to the lower precharge enable signal lpre_en.

The switching means SW includes a first transmission gate CMOS1, the drain of which is connected to the upper global I/O line UGIO, the source of which is connected to the lower global input/output line LGIO, the NMOS gate of which is applied with a memory region selection signal MRS and the PMOS gate of which is applied with an inverted memory region selection signal MRS; a second transmission gate CMOS2, the drain of which is connected to the upper global I/O line UGIO, the source of which is connected to the lower global I/O line LGIO, the NMOS gate of which is applied with the memory region selection signal MRS and the PMOS gate of which is applied with the inverted memory region selection signal MRS; and an inverter INV1 which receives and inverts the memory region selection signal MRS, and then, applies the signal into the PMOS gate. The switching means SW connects the pairs of upper and lower global I/O lines UGIO/UGIOb and LGIO/LGIOb in response to the memory region selection signal MRS.

The upper precharge driver UGIOPD and the lower precharge driver LGIOPD, which generate the upper precharge enable signal upre_en and the lower precharge enable signal lpre_en, will be described in detail with reference to FIG. 3.

Figure 3:
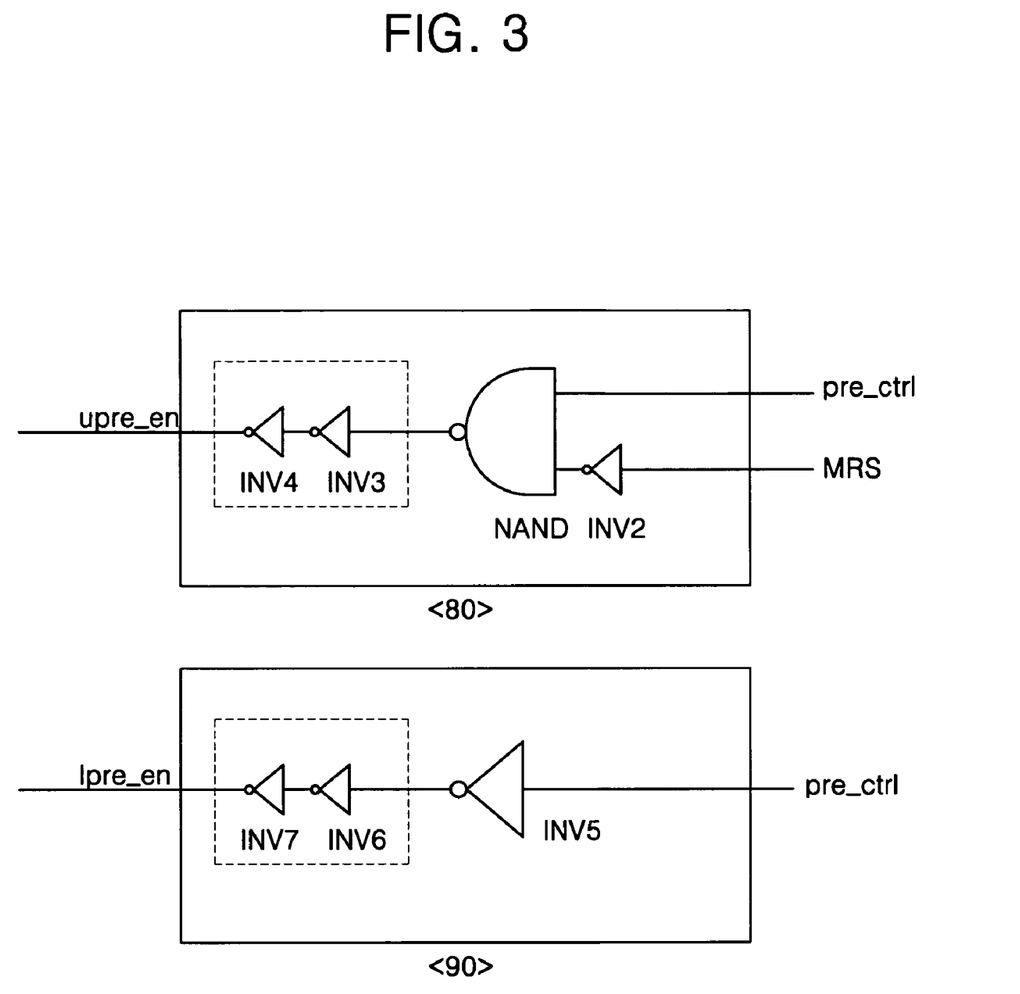
FIG. 3 shows exemplary precharge drivers of FIG. 2.

FIG. 3 shows exemplary precharge drivers of FIG. 2, where reference numeral 80 refers to the upper precharge driver UGIOPD, and reference numeral 90 refers to the lower precharge driver LGIOPD.

As shown in the drawing, the upper precharge driver UGIOPD 80 includes an inverter INV2, a NAND gate, and buffers INV3 and INV4, and the lower precharge driver LGIOPD 90 includes an inverter INV5 and buffers INV6 and INV7.

In the upper precharge driver UGIOPD 80, the inverter INV2 inverts the memory region selection signal MRS transmitted from the address control circuit 50, the NAND gate combines the precharge control signal pre_ctrl from the address control circuit 50 and the inverted memory region selection signal MRS by NAND logic to generate the upper precharge enable signal upre_en, and the buffers INV3 and INV4 apply the generated upper precharge enable signal upre_en to the pair of upper global I/O lines UGIO/UGIOb.

In the lower precharge driver LGIOPD 90, the inverter INV5 inverts the memory region selection signal MRS transmitted from the address control circuit 50 to generate the lower precharge enable signal lpre_en, and the buffers INV6 and INV7 apply the lower precharge enable signal lpre_en to the pair of upper global I/O lines UGIO/UGIOb.

Figure 4:
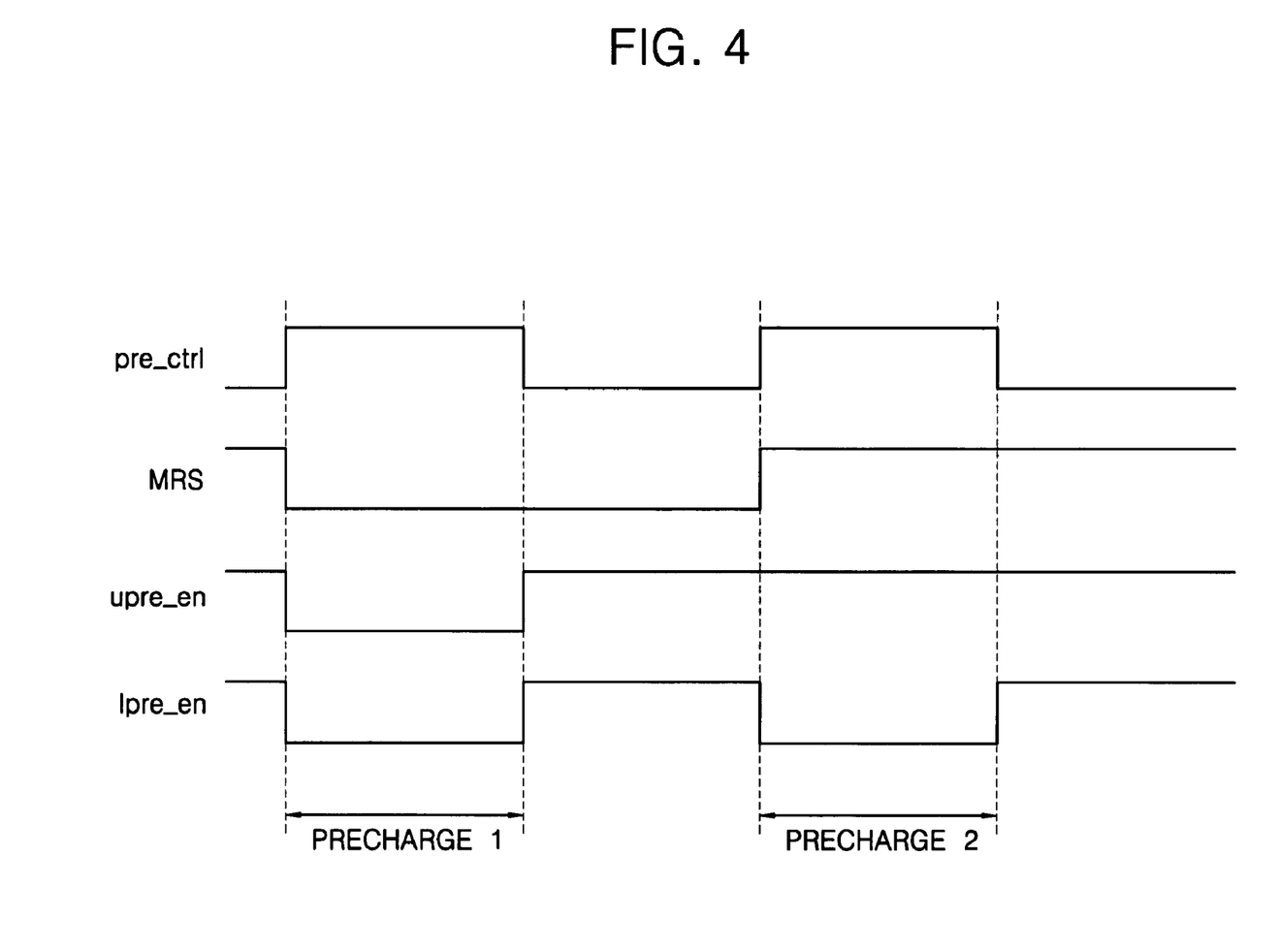
FIG. 4 shows timing and signal waveforms of precharging global I/O lines according to an embodiment of the present invention.

FIG. 4 shows timing and signal waveforms of precharging global I/O lines according to an embodiment of the present invention.

Typically, the address control circuit 50 generates the precharge control signal pre_ctrl to a logic high level in the precharge period, and generates the memory region selection signal MRS to a logic low level in the case that the first memory region 10 is selected, and generates the memory region selection MRS to a logic high level in the case that the second memory region 20 is selected.

First, in a first precharge period PRECHARGE 1, the operation of precharging a pair of global I/O lines GIO/GIOb is performed by the process as follows.

The address control circuit 50 generates a precharge control signal pre_ctrl to a logic high level and a memory region selection signal MRS to a logic low level.

The inverter INV2 of the precharge driver UGIOPD receives the memory region selection signal MRS at a logic low level, and inverts into a logic high level. The NAND gate receives the memory region selection signal MRS at a logic high level and the precharge control signal pre_ctrl at a logic high level, and by NAND logic, to generate an upper precharge enable signal upre_en to a logic low level. The buffers INV3 and INV4 receive and buffer the upper precharge enable signal upre_en to a logic low level, and output to the upper precharge circuit UGIOPC.

The inverter INV5 of the lower precharge driver LGIOPD inverts the precharge control signal pre_ctrl to a logic high level, and converts to a lower precharge enable signal lpre_en to a logic low level. The buffers INV6 and INV7 receive and buffer the lower precharge enable signal lpre_en to a logic low level, and output to the lower precharge circuit LGIOPC.

The PMOS PMOS1 to PMOS3 of the upper precharge circuit UGIOPC is turned on in accordance with the upper precharge enable signal upre_en at a logic low level transmitted from the upper precharge driver UGIOPD to precharge and equalize a pair of upper global I/O lines UGIO/UGIOb to a logic high level (precharge voltage Vdd).

The PMOS PMOS4 to PMOS6 of the lower precharge circuit LGIOPC is turned on in accordance with the lower precharge enable signal lpre_en at a logic low level transmitted from the lower precharge driver LGIOPD to precharge and equalize a pair of lower global I/O lines LGIO/LGIOb to a logic high level (precharge voltage Vdd).

The transfer gates CMOS1 and CMOS2 of the switching means SW is turned on in response to memory region selection signal MRS of low level, to connect upper global I/O lines UGIO/UGIOb and lower global I/O lines LGIO/LGIOb.

Thus, the pair of upper global I/O lines UGIO/UGIOb and the pair of lower global I/O lines LGIO/LGIOb are connected, and they are all precharged and equalized to a logic high level (precharge voltage Vdd).

Second, in a second precharge period PRECHARGE 2, the operation of precharging a pair of global I/O lines GIO/GIOb is performed by the process as follows.

The address control circuit 50 generates a precharge control signal pre_ctrl to a logic high level and a memory region selection signal MRS to a logic high level.

The inverter INV2 of the precharge driver UGIOPD receives the memory region selection signal MRS at a logic high level, and inverts into a logic low level. The NAND gate receives the memory region selection signal MRS at a logic low level and a precharge control signal pre_ctrl at a logic high level, and by NAND logic, to generate an upper precharge enable signal upre_en to a logic high level. The buffers INV3 and INV4 receive and buffer the upper precharge enable signal upre_en to a logic high level, and output to the upper precharge circuit UGIOPC.

The inverter INV5 of the lower precharge driver LGIOPD inverts the precharge control signal pre_ctrl to a logic high level, and converts to a lower precharge enable signal lpre_en to a logic low level. The buffers INV6 and INV7 receive and buffer the lower precharge enable signal lpre_en to a logic low level, and output to the lower precharge circuit LGIOPC.

The PMOS PMOS1 to PMOS3 of the upper precharge circuit UGIOPC is turned off in accordance with the upper precharge enable signal upre_en at a logic high level transmitted from the upper precharge driver UGIOPD so as not to precharge and equalize a pair of upper global I/O lines UGIO/UGIOb to a logic high level (precharge voltage Vdd).

The PMOS PMOS4 to PMOS6 of the lower precharge circuit LGIOPC is turned on in accordance with the lower precharge enable signal lpre_en at a logic low level transmitted from the lower precharge driver LGIOPD to precharge and equalize a pair of lower global I/O lines LGIO/LGIOb to a logic high level (precharge voltage Vdd).

The transfer gates CMOSL and CMOS2 of the switching means SW are turned off in response to the memory region selection signal MRS at a logic high level, to release the connection of the pair of upper global I/O lines UGIO/UGIOb and the pair of lower global I/O lines LGIO/LGIOb.

Thus, the connection of the upper global I/O lines UGIO/UGIOb and the lower global I/O lines LGIO/LGIOb is released, and only the pair of lower global I/O lines LGIO/LGIOb are precharged to a logic high level (precharge voltage Vdd) and equalized.

As described above and according to the present invention, in the case where the memory bank of the first memory region 10 is selected, the upper and lower global I/O lines UGIO and LGIO are all precharged, and in the case where the memory bank of the second memory region 20 is selected, only the lower global I/O lines LGIO are precharged.

In the case where the memory bank of the second memory region 20 is selected and the upper global I/O line is not used, the upper precharge drivers and the upper precharge circuits corresponding to the upper global I/O lines are not activated.

In an exemplary embodiment of the present invention, the semiconductor memory device and a method of precharging global I/O lines thereof have been described using a portion of the memory device, for example, the memory core. The present invention can also be used for I/O line precharge operations in all regions of the semiconductor memory device in the same manner.

A semiconductor memory device and a method of precharging global I/O lines thereof according to exemplary embodiments of the present invention provide a manner of detecting the memory region and the region of the global I/O lines through which data is input or output, using the bank selection signal, and allowing only the precharge driver corresponding to the detected global I/O lines through which data is input or output to perform precharge operations, thereby reducing power consumption during precharge operations.

While the present invention has been particularly shown and described with reference to exemplary embodiments thereof, it will be understood by those skilled in the art that various changes in form and details may be made therein without departing from the spirit and scope of the present invention as defined by the appended claims. For example, an internal configuration of circuit may be changed, or internal devices of circuit may be replaced with other equivalent devices. Accordingly, these and other changes and modifications are seen to be within the true spirit and scope of the invention as defined by the appended claims.

What is claimed is:

1. A semiconductor memory device comprising:
    a pair of first global input/output (I/O) lines connecting with a plurality of pairs of first local I/O lines;
    a pair of second global I/O lines connecting with a plurality of pairs of second local I/O lines;
    a first precharge circuit for precharging the pair of first global I/O lines in response to a first precharge enable signal;
    a second precharge circuit for precharging the pair of second global I/O lines in response to a second precharge enable signal;
    a switch for connecting the pair of first global I/O lines and the pair of second global I/O lines;
    a first precharge driver for enabling the first precharge enable signal when a first memory region is selected during a precharge operation; and
    a second precharge driver for enabling the second precharge enable signal when the first memory region is selected during a precharge operation or when a second memory region is selected during a precharge operation,
    wherein the first and second precharge drivers enable the first and second precharge enable signals based on at least one of a precharge control signal, a memory region selection signal, and enable information from a first or a second row decoder.

2. The semiconductor memory device according to claim 1,
wherein the pair of first global input/output (I/O) lines is for inputting or outputting data to or from a first memory region when the first memory region is selected;
wherein the pair of second global I/O lines is for inputting or outputting data to or from the pair of first global I/O lines when the first memory region is selected and for inputting or outputting data to or from a second memory region when the second memory region is selected; and
wherein the switch connects the pair of first global I/O lines and the pair of second global I/O lines when the first memory region is selected during a precharge operation.

3. The semiconductor memory device according to claim 2, wherein the first precharge driver generates the first precharge enable signal in response to a memory region selection signal selecting the first or second memory region and a precharge control signal for a precharge operation.

4. The semiconductor memory device according to claim 3, wherein the memory region selection signal is a bank selection signal for selecting the first or second memory region.

5. The semiconductor memory device according to claim 3, wherein the precharge control signal is generated in response to a command signal.

6. The semiconductor memory device according to claim 3, wherein the first precharge driver comprises:
an inverter inverting the memory region selection signal;
a logic gate for generating the first precharge enable signal by combining an output signal of the inverter and the precharge control signal; and
a buffer for driving the first precharge enable signal.

7. The semiconductor memory device according to claim 1, wherein the second precharge driver generates the second precharge enable signal in response to the precharge control signal to perform a precharge operation.

8. The semiconductor memory device according to claim 7, wherein the precharge control signal is generated in response to a command signal.

9. The semiconductor memory device according to claim 7, wherein the second precharge driver comprises:
an inverter inverting the precharge control signal and generating the second precharge enable signal; and
a buffer for driving the second precharge enable signal.

10. A semiconductor memory device comprising:
a pair of first global input/output (I/O) lines connecting with a plurality of pairs of first local I/O lines for inputting or outputting data to or from a first memory region when the first memory region is selected;
a pair of second global I/O lines connecting with a plurality of pairs of second local I/O lines for inputting or outputting data to or from the pair of first global I/O lines when the first memory region is selected and for inputting or outputting data to or from a second memory region when the second memory region is selected;
a first precharge circuit for precharging the pair of first global I/O lines when the first memory region is selected during a precharge operation;
a second precharge circuit for precharging the pair of second global I/O lines when the first memory region is selected during a precharge operation or when a second memory region is selected during a precharge operation; and
a switch for connecting the pair of first global I/O lines and the pair of second global I/O lines when the first memory region is selected,
wherein the first and second precharge circuits precharge based on at least one of a precharge control signal, a memory region selection signal, and enable information from a first or a second row decoder.

11. The semiconductor memory device according to claim 10, further comprising:
a precharge control unit for enabling a first precharge enable signal driving the first precharge circuit and a second precharge enable signal driving the second precharge circuit concurrently when the first memory region is selected, and enabling the second precharge enable signal only when the second memory region is selected.

12. The semiconductor memory device according to claim 11, wherein the precharge control unit comprises:
a first precharge driver for enabling the first precharge enable signal when the first memory region is selected during a precharge operation; and
a second precharge driver for enabling the second precharge enable signal during a precharge operation.

13. The semiconductor memory device according to claim 12, wherein the first precharge driver receives a memory region selection signal for selecting the first or second memory region and a precharge control signal for performing a precharge operation, and generates the first precharge enable signal.

14. The semiconductor memory device according to claim 13, wherein the memory region selection signal is a bank selection signal for selecting the first or second memory region.

15. The semiconductor memory device according to claim 13, wherein the precharge control signal is generated in response to a command signal.

16. The semiconductor memory device according to claim 13, wherein the first precharge driver comprises:
an inverter inverting the memory region selection signal;
a logic gate for generating the first precharge enable signal by combining an output signal of the inverter and the precharge control signal; and
a buffer for driving the first precharge enable signal.

17. The semiconductor memory device according to claim 12, wherein the second precharge driver receives a precharge control signal for performing a precharge operation, and generates the second precharge enable signal.

18. The semiconductor memory device according to claim 17, wherein the precharge control signal is generated in response to a command signal.

19. The semiconductor memory device according to claim 17, wherein the second precharge driver comprises:
an inverter inverting the precharge control signal and generating the second precharge enable signal; and
a buffer for applying the second precharge enable signal.

20. A method of precharging global input/output (I/O) lines of a semiconductor memory device having a pair of first global I/O lines connecting with a plurality of pairs of first local I/O lines for inputting or outputting data to or from a first memory region when the first memory region is selected, and a pair of second global I/O lines connecting with a plurality of pairs of second local I/O lines for inputting or outputting data to or from the first memory region when the first memory region is selected, and for inputting or outputting data of a second memory region when the second memory region is selected, the method comprising the steps of:

precharging the pair of first global I/O lines and the pair of second global I/O lines concurrently when the first memory region is selected during a precharge operation; and precharging only the pair of second global I/O lines when the second memory region is selected during a precharge operation, wherein precharging is based on at least one of a precharge control signal, a memory region selection signal, and enable information from a first or a second row decoder.

21. The method according to claim 20, wherein the step of precharging the pair of first global I/O lines comprises:

enabling a first precharge enable signal when the first memory region is selected during a precharge operation;

precharging the pair of first global I/O lines in response to the first precharge enable signal;

enabling a second precharge enable signal when the first memory region is selected during a precharge operation; and precharging the pair of second global I/O lines in response to the second precharge enable signal.

22. The method according to claim 20, wherein the step of precharging the pair of second global I/O lines comprises:

disabling a first precharge enable signal when the second memory region is selected during a precharge operation;

enabling a second precharge enable signal when the second memory region is selected during a precharge operation and;

precharging the pair of second global I/O lines in response to the second precharge enable signal.

23. The method according to claim 20, further comprising the step of connecting the pair of first global I/O lines and the pair of second global I/O lines when the first memory region is selected.

24. The method according to claim 20, further comprising the step of stopping the connection of the pair of first global I/O lines and the pair of second global I/O lines when the second memory region is selected.

* * * * *